US006200867B1

(12) United States Patent
Chen

(10) Patent No.: US 6,200,867 B1
(45) Date of Patent: *Mar. 13, 2001

(54) METHOD FOR FORMING RAISED SOURCE AND DRAIN

(75) Inventor: Yi-Shi Chen, Hsinchu (TW)

(73) Assignee: Winbond Electronics Corporation, Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,504

(22) Filed: Nov. 17, 1998

(51) Int. Cl.$^7$ .................... H01L 21/336; H01L 21/4763; H01L 21/44
(52) U.S. Cl. .................. 438/300; 438/299; 438/303; 438/592; 438/642; 438/649; 438/655; 438/664; 438/682
(58) Field of Search ................... 438/299, 300, 438/301, 303, 642, 643, 647, 648, 649, 650, 651, 652, 653, 655, 656, 660, 664, 682, 683, 586, 592

(56) References Cited

U.S. PATENT DOCUMENTS

| 5,384,281 | * | 1/1995 | Kenney et al. | 438/702 |
| 5,565,383 | * | 10/1996 | Sakai | 438/664 |
| 5,656,537 | * | 8/1997 | Iwamatsu et al. | 438/402 |
| 5,824,586 | * | 10/1998 | Wollesen et al. | 438/300 |

* cited by examiner

Primary Examiner—Charles Bowers
Assistant Examiner—Thanhha Pham
(74) Attorney, Agent, or Firm—Finnegan, Henderson, Farabow, Garrett & Dunner, L.L.P.

(57) ABSTRACT

A method for forming self-aligned raised source and drain regions on a semiconductor wafer includes the steps of defining a substrate, growing a first layer of dielectric material over the substrate, depositing a layer of polysilicon over the first layer of dielectric material, patterning and forming at least one gate, depositing a second layer of dielectric material over the gate and the first dielectric layer and masking the second dielectric layer to define a source region and a drain region. The method also includes the steps of anisotropically etching to form sidewall spacers contiguous with the gate, collimated sputtering to deposit a layer of silicon, and implanting ions into the deposited silicon.

19 Claims, 7 Drawing Sheets

METHOD FOR FORMING RAISED SOURCE AND DRAIN

BACKGROUND OF THE INVENTION

1. Field of the Invention

This invention pertains in general to a method for forming raised source and drain regions in a semiconductor transistor device and, more particularly, to a method of forming self-aligned raised source and drain regions in a metal-oxide semiconductor ("MOS") transistor device.

2. Description of the Related Art

As transistor dimensions in integrated circuits become smaller, the formation of ultra-shallow transistor junctions has become an important consideration in device formation. A mechanism that allows the formation of ultra-shallow junctions is through the formation of raised, or elevated, source and drain regions.

The material that constitutes the raised source and drain regions is generally the same as the device substrate, which in most instances is silicon. The raised source and drain regions may also be used as alternative self-aligned contacts in ultra-large silicon integration ("ULSI") MOS devices, but they first need to be metalized. A metalized silicon, or silicide, is silicon combined with a metal, and is formed over the source and drain regions. Silicides may be provided as a Group VIII silicide (PtSi, $Pd_2Si$, $CoSi_2$ and $NiSi_2$) or as $TiSi_2$.

In a standard CMOS process, a low-density implant step is performed by using a polysilicon gate as a mask to form what will later become lightly-doped drain ("$L_{DD}$") regions in the device substrate. An oxide layer is then formed over the device substrate and surrounds the gate. The oxide layer is etched, leaving oxide layers contiguous with the sides of the gate. These oxide layers are known as oxide spacers. Because the lateral dimensions of the spacers are usually very small, subsequent formation of suicides may bridge the separation between source and drain silicides and cause the gate to become short-circuited. This is known as salicide bridging.

The conventional method continues by forming raised source and drain regions. This may be accomplished through either epitaxial growth of silicon or deposition of silicon. Epitaxial growth requires high temperature that may cause excessive diffusion of impurities implanted to form the $L_{DD}$ regions. The step of depositing silicon to form raised source and drain regions may be accomplished through sputtering of silicon. A conventional sputtering process bombards a silicon target, or a sheet of pure silicon, with energetic ions to dislodge a plurality of silicon atoms from the target. Because the dislodged silicon atoms move in arbitrary directions, the silicon atoms will coat the entire surfaces of the spacers with silicon, which would require additional steps to remove the silicon from the undesired surfaces of the spacers. However, the silicon removal steps will damage the spacers, which would require additional steps to reform the spacers.

SUMMARY OF THE INVENTION

Accordingly, the present invention is directed to a method of forming raised source and drain regions that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a method for forming self-aligned silicide contacts on a semiconductor wafer having a gate dielectric layer and at least one polysilicon gate disposed over the gate dielectric layer. The method includes the steps of depositing a layer of spacer dielectric over the gate and the gate dielectric layer, masking the layer of spacer dielectric to define a source region and a drain region, while leaving the polysilicon gate exposed and anisotropically etching to remove the spacer dielectric deposited over the gate and the spacer dielectric and the gate dielectric layer disposed over the source region and the drain region to form sidewall spacers of the spacer dielectric contiguous with the gate. The method also includes the steps of collimated sputtering to deposit a layer of silicon, depositing a layer of metal and heating the wafer to induce silicide reaction between the deposited silicon and the deposited metal to form silicides over the source and drain regions and the gate.

In one aspect of the invention, the method also includes a step of removing the silicon layer deposited over the sidewall spacers.

In another aspect, the method includes a step of reforming the sidewall spacers.

Also in accordance with the invention, there is provided a method for forming raised source and drain regions on a semiconductor wafer that includes a gate dielectric layer and at least one polysilicon gate disposed over the gate dielectric layer. The method includes the steps of depositing a layer of spacer dielectric over the gate and the gate dielectric layer, masking the layer of spacer dielectric to define a source region and a drain region and leaving the polysilicon gate exposed, and anisotropically etching to remove the spacer dielectric deposited over the gate and the spacer dielectric and the gate dielectric layer disposed over the source region and the drain region to form sidewall spacers of the spacer dielectric contiguous with the gate. The method also includes the steps of collimated sputtering to deposit a layer of silicon, and implanting ions into the semiconductor wafer through the deposited layer of silicon to form source and drain regions in the wafer.

In one aspect of the invention, the method also includes the steps of depositing a layer of metal after the step of collimated sputtering, and heating the wafer to induce silicide reaction between the deposited silicon and the deposited metal.

In another aspect, the method additionally includes a step, prior to the step of depositing a layer of spacer dielectric, of implanting ions to form $L_{DD}$ regions.

Further in accordance with the invention, there is provided a method for forming a semiconductor device that includes the steps of defining a substrate, growing a first layer of dielectric material over the substrate, depositing a layer of polysilicon over the first layer of dielectric material, and patterning the layer of polysilicon and forming at least one gate. The method also includes the steps of depositing a second layer of dielectric material over the gate and the first dielectric layer, masking the second dielectric layer to define a source region and a drain region and leaving the gate exposed, and anisotropically etching to remove the second dielectric layer deposited over the gate and the first dielectric layer and the second dielectric layer disposed over the source region and the drain region to form sidewall spacers of the second dielectric contiguous with the gate. Additionally, the method includes the steps of collimated sputtering to deposit a layer of silicon, and implanting ions into the defined source and drain regions in the substrate through the deposited silicon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

In accordance with the present invention, there is provided a method of forming self-aligned raised source and drain regions in an MOS device. The method of the present invention also provides self-aligned silicide contacts.

A method of the present invention will now be explained with reference to FIGS. 1–7. For convenience of explanation and illustrative purposes, FIGS. 1–7 show the method of the present invention with one MOS transistor. The steps of the method disclosed herein can, however, readily be adapted to form a plurality of MOS transistors.

Figure 1:
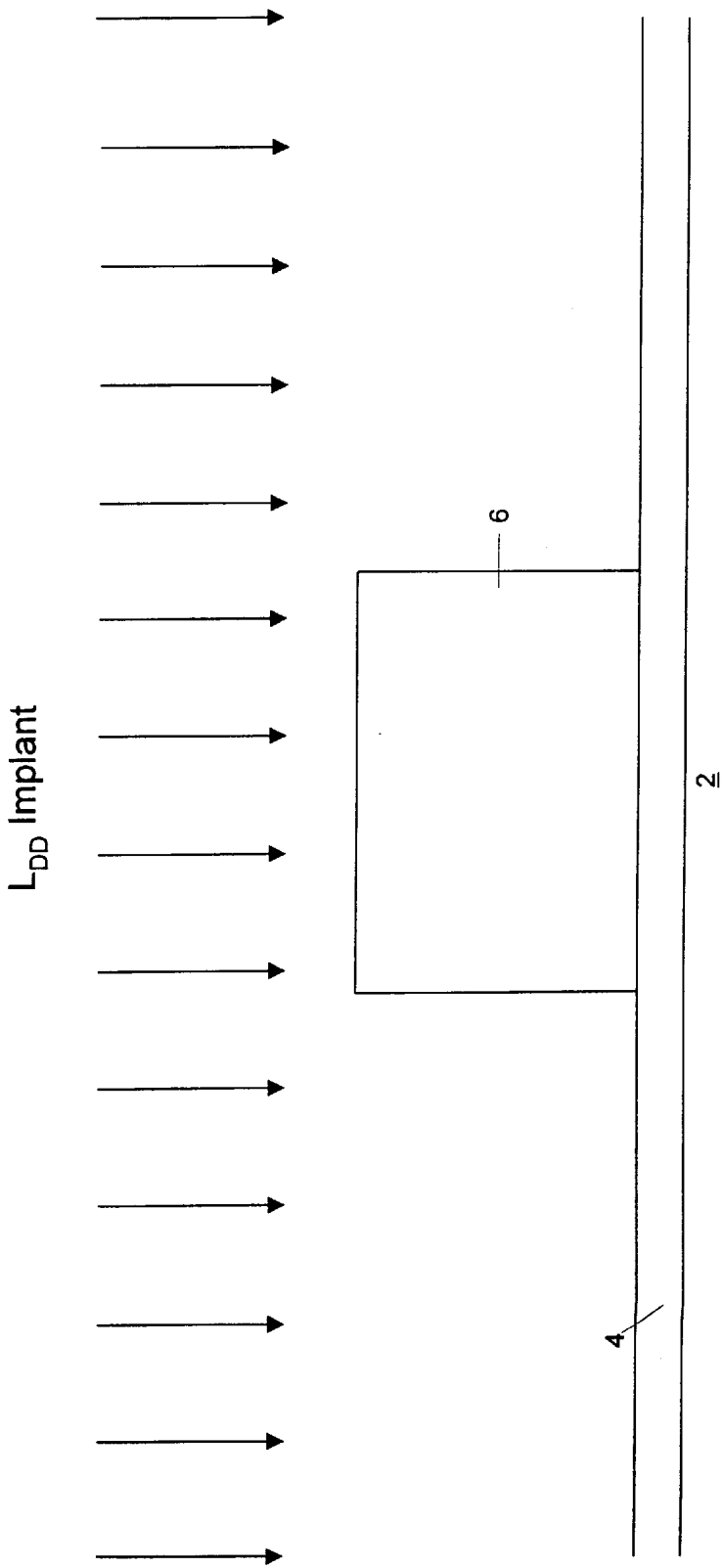
FIGS. 1–7 are cross-sectional views of the steps in a method of the present invention for forming raised source and drain regions.

Referring to FIG. 1, after defining a silicon substrate 2, a layer of gate oxide 4 is formed over substrate 2. Gate oxide 4 is preferably silicon dioxide grown through an oxidation process, but may be composed of other known dielectric material such as silicon nitride and silicon oxynitride. A layer of polysilicon (not shown) is deposited through chemical-vapor deposition ("CVD") over gate oxide 4. A photoresist (not shown) is then applied over the surface of deposited polysilicon and patterned to remove portions of the polysilicon to form a plurality of gates 6 of which only one is illustrated. The photoresist is then removed and gate 6 is disposed over gate oxide 4, which is disposed over substrate 2. Using gate 6 as a mask, a low-density implant of impurities is performed to form $L_{DD}$ regions in substrate 2 of the to-be-formed MOS transistor.

Figure 2:
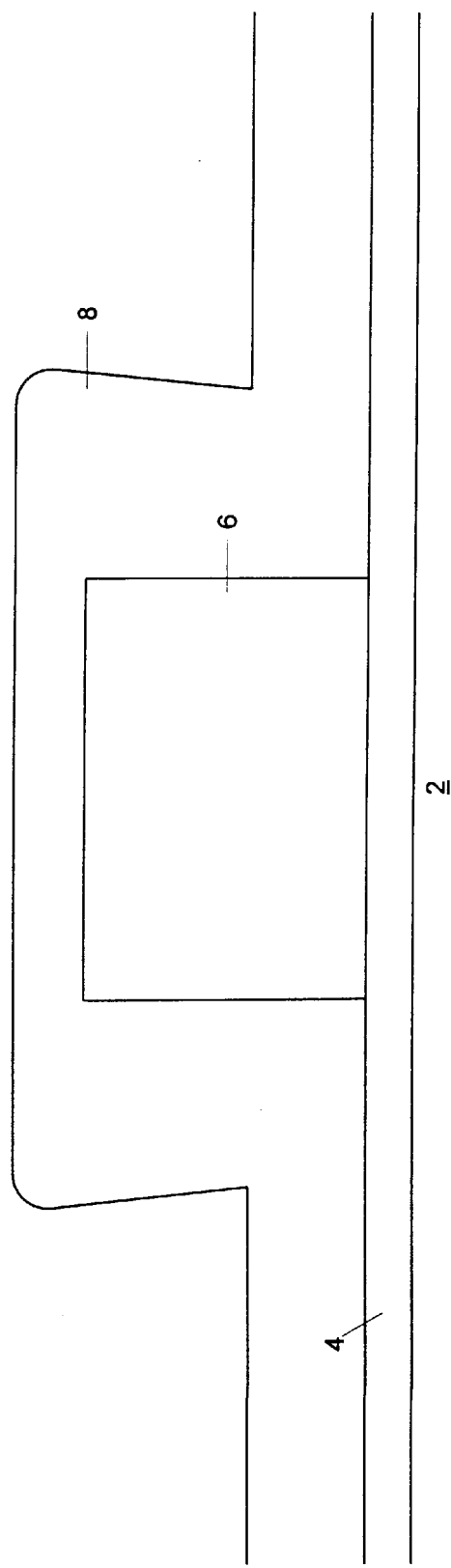

Referring to FIG. 2, a layer of dielectric material 8 is deposited over gate 6 and gate oxide layer 4. Dielectric material 8 may be deposited by a CVD process and may be composed of any know dielectric material, including silicon dioxide, silicon nitride and silicon oxynitride. Dielectric material 8 surrounds and is contiguous with gate 6, including its top and side walls. A photoresist (not shown) is applied over the surface of dielectric material 8 and patterned to define a source region and a drain region. The patterned photoresist also leaves gate 6 exposed. The photoresist-dielectric-gate oxide structure is etched anisotropically to remove dielectric material 8 deposited over gate 6. The anisotropic etching also removes gate oxide 4 and dielectric material 8 disposed over the defined source and drain regions. Because the vertical dimension of dielectric material 8 on the side walls of gate 6 is greater than its horizontal dimension, some dielectric material 8 will be left on the side walls of gate 6 after the anisotropic etching process. The remaining dielectric material 8 is shown in FIG. 3.

Figure 3:
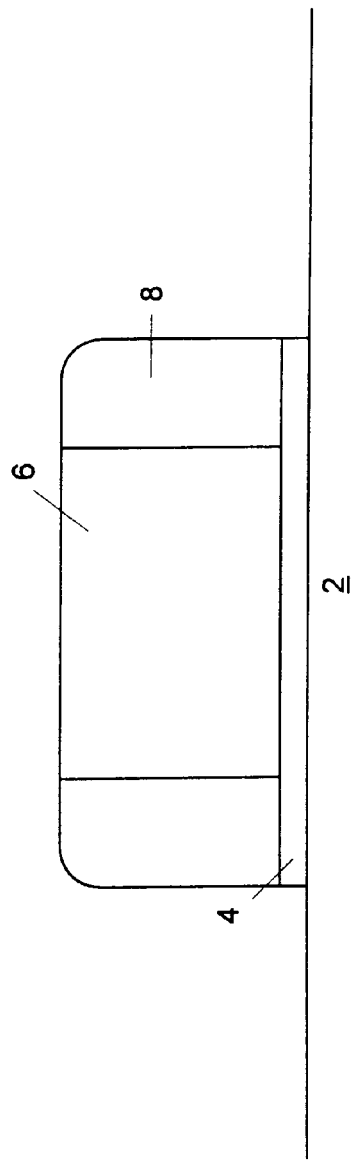

Referring to FIG. 3, the remaining dielectric material 8 (hereinafter "sidewall spacers 8") is contiguous with the sidewalls of gate 6. In addition, gate oxide 4, other than that beneath sidewall spacers 8 and gate 6, is removed during the anisotropic etching process. Anisotropic etching produces sidewall spacers that exhibit a vertical profile, i.e., are vertically oriented and include a vertical side surface, which is important for the subsequent sputtering step of the present invention.

Figure 4:
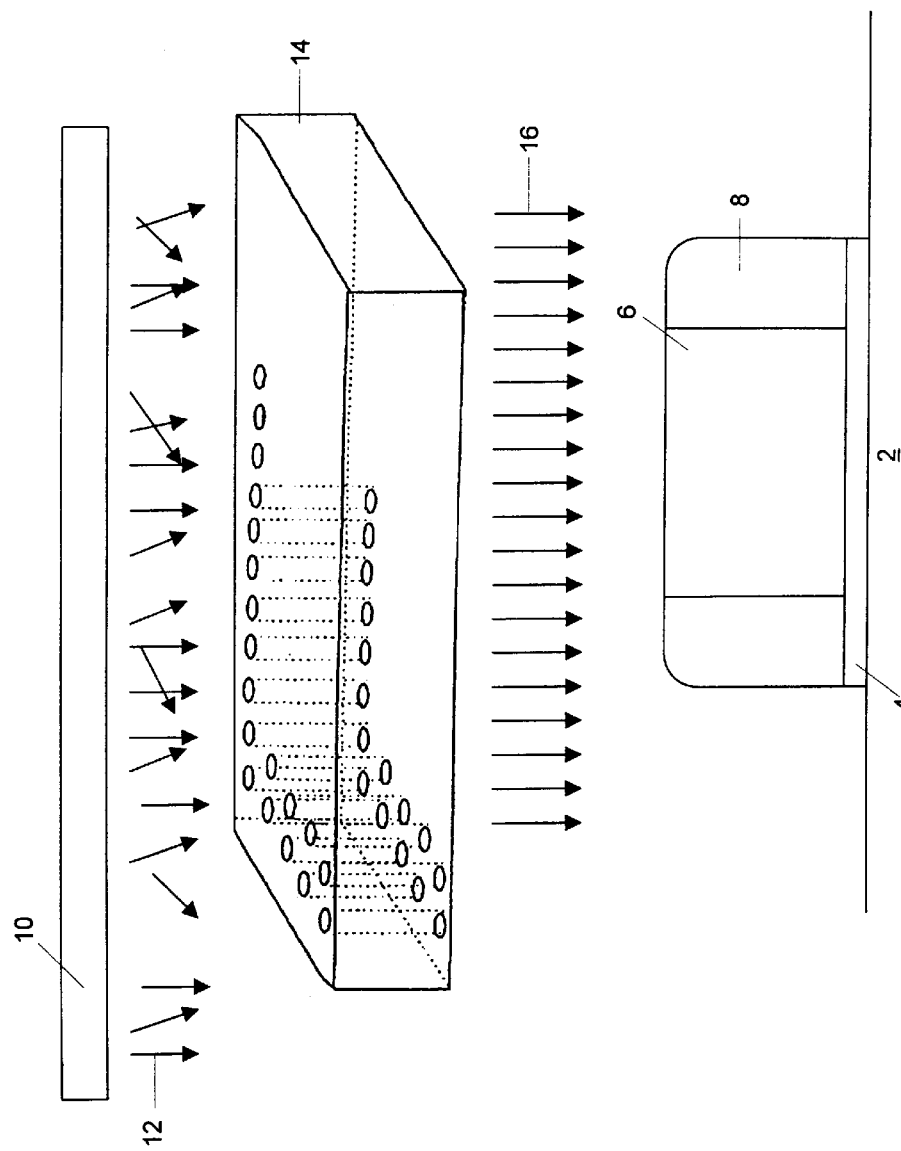

Referring to FIG. 4, a step of collimated sputtering to form raised source and drain regions is disclosed. A silicon target 10 is bombarded with ions to dislodge a plurality of silicon atoms 12 off target 10. As shown in FIG. 4, silicon atoms 12 initially move in arbitrary directions. A collimator 14 having a plurality of vertical openings is provided between silicon target 10 and the MOS transistor structure. Collimator 14 only permits silicon atoms 12 having a primarily vertical velocity component to pass through. Collimated silicon atoms 16, or those silicon atoms 12 having a primarily vertical velocity component, will coat only the horizontal surfaces of the MOS transistor structure. Therefore, silicon atoms 16 will coat the defined source and drain regions and the top of gate 6 but only a few, if any, silicon atoms 16 will coat the sides of sidewall spacers 8 because sidewall spacers 8 exhibit a vertical profile.

If some silicon atoms are deposited on the sides of sidewall spacer 8, the MOS transistor structure may be lightly dipped in acid or etched to remove silicon atoms deposited on the sides of sidewall spacers 8. Silicon atoms deposited over sidewall spacers 8 will likewise be removed during the light-etching process. A factor that will determine whether such light-etch should be performed is the gate to source/drain leakage, which may be measured after silicides have been formed. If leakage is detected, sidewall spacers 8 should be etched to remove at least a portion of sidewall spacers 8. Because of the light dipping or light etching, sidewall spacers 8 are not likely to be damaged, and therefore no sidewall spacer reformation should be required. However, if particular applications require high quality sidewall spacers, they may be reformed by repeating the steps for forming sidewall spacers 8.

Figure 5:
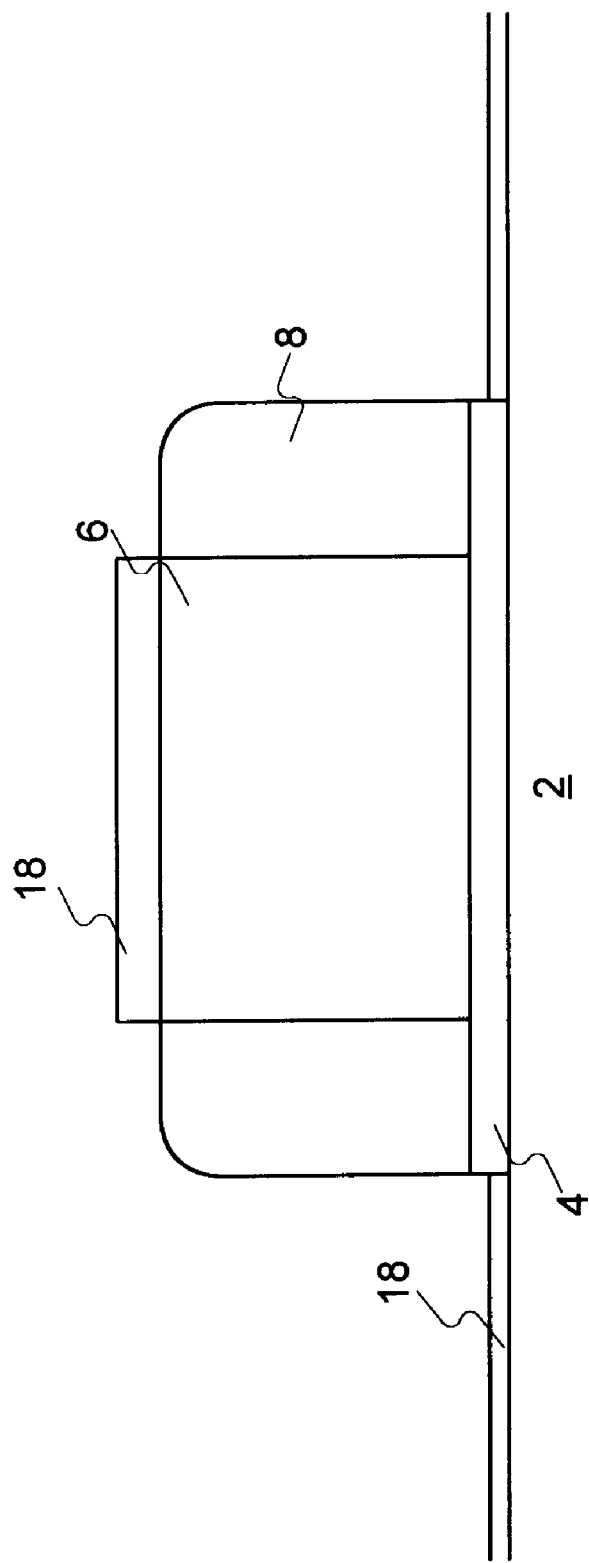

Referring to FIG. 5, the sputtering results in substantially only surfaces over gate 6 and the defined source and drain regions being coated with silicon layers 18. Silicon layers 18 deposited over the source and drain regions are self-aligned raised source and drain regions. In addition, if silicon layers 18 deposited over gate 6 and the source and drain regions are metalized, silicon layers 18 become silicides, which may be used later as self-aligned silicide contacts.

Figure 6:
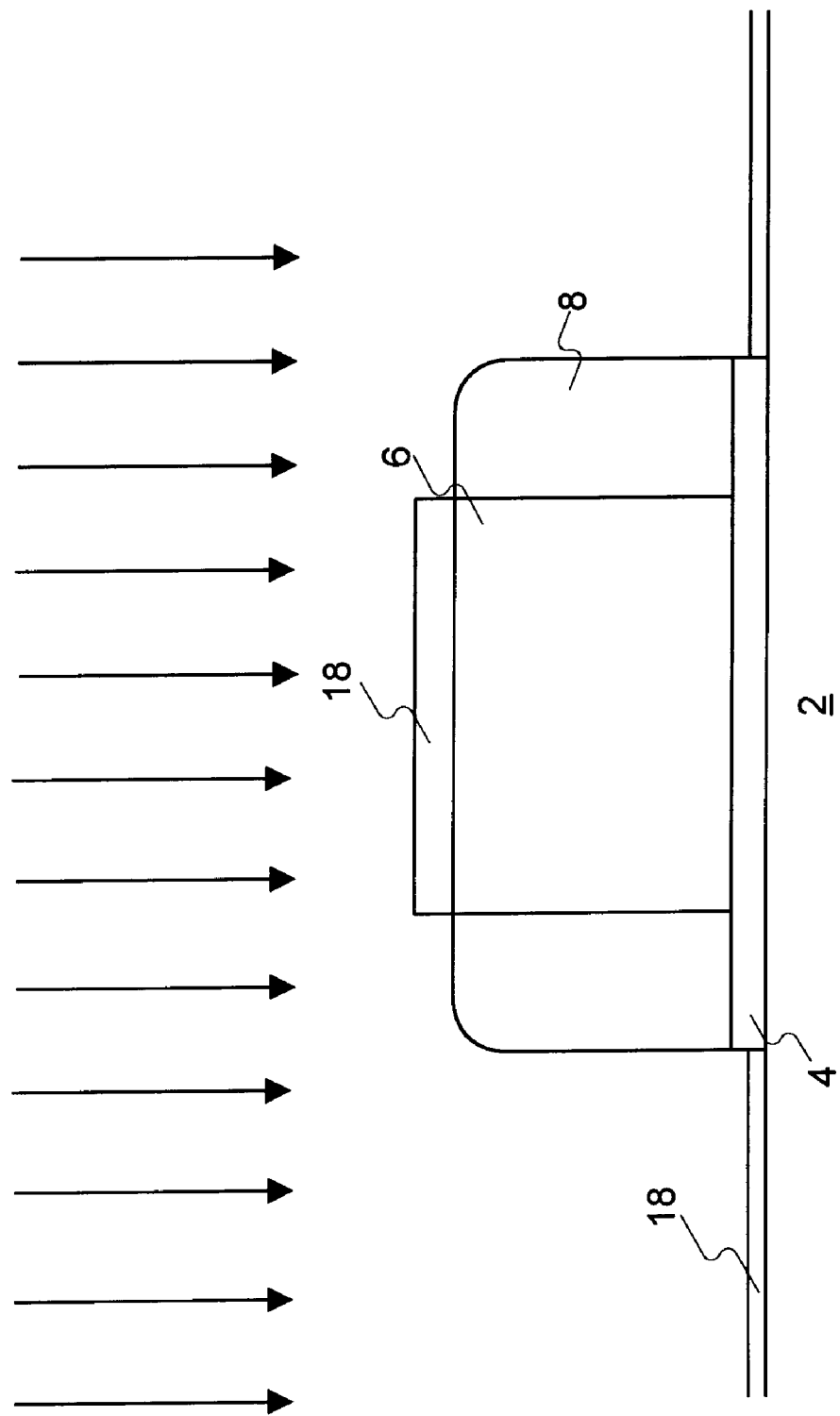

Referring to FIG. 6, using gate 6 and sidewall spacers 8 as masks, heavy implantation of impurities is performed to define the source and drain regions in substrate 2. When substrate 2 is heated, both the $L_{DD}$ implant described above and the heavy ion implant will diffuse to form the source and drain regions and their respective $L_{DD}$ regions in substrate 2.

Figure 7:
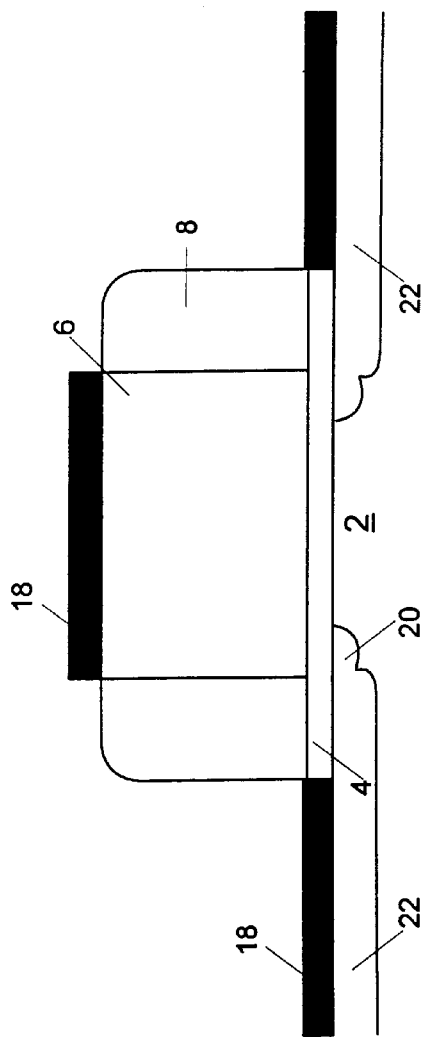

Referring to FIG. 7, the implantation and heating process shown in FIG. 6 results in the diffused $L_{DD}$ regions 20 extending underneath gate 6. The process also results in formation of source and drain regions 22 that extend underneath sidewall spacers 8. In addition, silicon layers 18 may be metalized to form silicide contacts. Such formation of silicide contacts can be performed by first depositing metal into silicon layers 18, and then heating the substrate to induce a silicide reaction between deposited silicon layer 18 and the deposited metal. The photoresist deposited in connection with the process resulting in the structuring shown in FIG. 3, is then removed. Silicon layers 18 becomes silicides 18. Silicides 18 are formed over gate 6 and source and drain regions 22. The deposited metal may be Ti or any group VIII metals, including Co, Pt, Pd and Ni, to form silicides, such as $TiSi_2$, $CoSi_2$, PtSi, $Pd_2Si$, and $NiSi_2$.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming self-aligned silicide contacts on a semiconductor wafer having a gate dielectric layer and at least one polysilicon gate disposed over the gate dielectric layer, comprising the steps of:

depositing a layer of spacer dielectric over the gate and the gate dielectric layer;

masking said layer of spacer dielectric to define a source region and a drain region and leaving the polysilicon gate exposed;

anisotropically etching to remove said spacer dielectric deposited over the gate and said spacer dielectric and the gate dielectric layer disposed over said source region and said drain region to form sidewall spacers of said spacer dielectric contiguous with the gate;

collimated sputtering to deposit a silicon layer on horizontal surfaces of the polysilicon gate, the source region and the drain region;

depositing a layer of metal on said silicon layer; and heating the wafer to induce silicide reaction between said deposited silicon and said deposited metal to form silicides over said source regions, said drain region and the gate.

2. The method as claimed in claim 1 wherein said deposited metal is Ti, Co, Pt, Pd, or Ni.

3. The method as claimed in claim 1 further comprising a step of removing said silicon layer deposited over said sidewall spacers.

4. The method as claimed in claim 3 further comprising a step of reforming said sidewall spacers.

5. A method for forming raised source and drain regions on a semiconductor wafer including a gate dielectric layer and at least one polysilicon gate disposed over the gate dielectric layer, comprising the steps of:

depositing a layer of spacer dielectric over the gate and the gate dielectric layer;

masking said layer of spacer dielectric to define a source region and a drain region and leaving the polysilicon gate exposed;

anisotropically etching to remove said spacer dielectric deposited over the gate and said spacer dielectric and the gate dielectric layer disposed over said source region and said drain region to form sidewall spacers of said spacer dielectric contiguous with the gate;

collimated sputtering to deposit a silicon layer on horizontal surfaces of the polysilicon gate, the source region and the drain region;

implanting ions into the semiconductor wafer through said deposited layer of silicon to form source and drain regions in the wafer.

6. The method as claimed in claim 5 further comprising the steps of depositing a layer of metal on said silicon layer after said step of collimated sputtering; and heating the wafer to induce silicide reaction between said deposited silicon and said deposited metal.

7. The method as claimed in claim 6 wherein said deposited metal is Ti, Co, Pt, Pd, or Ni.

8. The method as claimed in claim 5 further comprising a step, prior to said step of depositing a layer of spacer dielectric, of implanting ions to form $L_{DD}$ regions.

9. The method as claimed in claim 5 wherein said step of implanting ions is heavy implantation of impurities.

10. The method as claimed in claim 5 further comprising a step of removing said silicon layer deposited over said sidewall spacers.

11. The method as claimed in claim 10 further comprising a step of reforming said sidewall spacers.

12. The method as claimed in claim 8 further comprising a step, after said implanting ions step, of heating the wafer to diffuse said ions implanted to form said $L_{DD}$ regions and to diffuse said ions implanted to form said source and drain regions in the wafer, said $L_{DD}$ regions extending underneath the gate.

13. A method for forming a semiconductor device, comprising the steps of:

defining a substrate;

growing a first layer of dielectric material over said substrate;

depositing a layer of polysilicon over said first layer of dielectric material;

patterning said layer of polysilicon and forming at least one gate;

depositing a second layer of dielectric material over said gate and said first dielectric layer;

masking said second dielectric layer to define a source region and a drain region and leaving said gate exposed;

anisotropically etching to remove said second dielectric layer deposited over said gate and said first dielectric layer and said second dielectric layer disposed over said source region and said drain region to form sidewall spacers of said second dielectric contiguous with said gate;

collimated sputtering to deposit a silicon layer on horizontal surfaces of the polysilicon gate, the source region and the drain region; and implanting ions into said defined source and drain regions in said substrate through said deposited silicon.

14. The method as claimed in claim 13 further comprising the steps of:

depositing a layer of metal on said silicon layer after said step of collimated sputtering; and heating the wafer to induce silicide reaction between said deposited silicon and said deposited metal.

15. The method as claimed in claim 14 wherein said deposited metal is Ti, Co, Pt, Pd, or Ni.

16. The method as claimed in claim 13 further comprising a step, prior to the step of depositing a second layer of dielectric material, of implanting ions to form $L_{DD}$.

17. The method as claimed in claim 13 wherein said second dielectric layer may be composed of silicon dioxide, silicon nitride or silicon oxynitride.

18. The method as claimed in claim 13 further comprising a step of removing said silicon layer deposited over said sidewall spacers.

19. The method as claimed in claim 18 further comprising a step of reforming said sidewall spacers.

* * * * *